United States Patent
Matsumoto et al.

(10) Patent No.: US 7,528,490 B2
(45) Date of Patent: May 5, 2009

(54) SEMICONDUCTOR DEVICE AND FERROELECTRIC MEMORY, AND METHOD FOR MANUFACTURING SEMICONDUCTOR DEVICE

(75) Inventors: Akihito Matsumoto, Nagano (JP); Toshiyuki Kamiya, Nagano (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 11/147,038

(22) Filed: Jun. 7, 2005

(65) Prior Publication Data

US 2005/0285276 A1 Dec. 29, 2005

(30) Foreign Application Priority Data

Jun. 25, 2004 (JP) .............................. 2004-188351

(51) Int. Cl.
H01L 23/48 (2006.01)
H01L 23/52 (2006.01)
H01L 29/40 (2006.01)

(52) U.S. Cl. ....................................... 257/774; 257/295

(58) Field of Classification Search ................ 257/303, 257/306, E33.012, E27.086, 295, E27.104, 257/E21.663, E21.664, E21.436, E21.208, 257/E29.164, E29.272, 774
See application file for complete search history.

(56) References Cited

U.S. PATENT DOCUMENTS

| | | | | |
|---|---|---|---|---|
| 5,466,629 A * | 11/1995 | Mihara et al. ................... 438/3 |
| 5,561,307 A | 10/1996 | Mihara et al. |
| 6,169,305 B1 | 1/2001 | Takai et al. |
| 6,316,801 B1 * | 11/2001 | Amanuma ................... 257/306 |
| 6,363,004 B1 | 3/2002 | Kang et al. |
| 6,482,658 B2 | 11/2002 | Kang et al. |
| 6,521,927 B2 * | 2/2003 | Hidaka et al. ................ 257/295 |
| 6,559,469 B1 * | 5/2003 | Paz de Araujo et al. ........ 257/15 |
| 6,623,985 B1 * | 9/2003 | Igarashi .......................... 438/3 |
| 6,773,979 B2 | 8/2004 | Okuno et al. |
| 6,831,323 B2 | 12/2004 | Ito et al. |
| 6,891,715 B2 | 5/2005 | Mikawa et al. |
| 6,917,063 B2 | 7/2005 | Natori et al. |
| 7,268,036 B2 | 9/2007 | Ito et al. |
| 2004/0159874 A1 * | 8/2004 | Tsuchiya et al. ............. 257/306 |
| 2005/0101034 A1 * | 5/2005 | Aggarwal et al. ............... 438/3 |
| 2005/0199928 A1 | 9/2005 | Mikawa et al. |
| 2005/0263809 A1 | 12/2005 | Natori et al. |

FOREIGN PATENT DOCUMENTS

JP 06-188386 7/1994

(Continued)

*Primary Examiner*—Dao H Nguyen
*Assistant Examiner*—Tram H Nguyen
(74) *Attorney, Agent, or Firm*—Harness, Dickey & Pierce, P.L.C.

(57) ABSTRACT

A capacitor section is formed with a lower electrode provided on a $SiO_2$ layer above an impurity layer provided in a substrate, a ferroelectric layer provided on the lower electrode, and an upper electrode provided on the ferroelectric layer. Further, the semiconductor device is equipped with a $SiO_2$ layer that electrically insulates the upper electrode from a wiring, a first contact hole in which a W plug is formed for electrically connecting the impurity layer and the lower electrode, and a second contact hole for electrically connecting the upper electrode and the wiring. The first contact hole and the second contact hole are opened at positions mutually deviated as viewed in a plan view of the capacitor section.

2 Claims, 5 Drawing Sheets

FOREIGN PATENT DOCUMENTS

| | | | |
|---|---|---|---|
| JP | 10-065113 | | 3/1998 |
| JP | 10065113 | * | 6/1998 |
| JP | 10-229168 | | 8/1998 |
| JP | 2000-091539 | | 3/2000 |
| JP | 2001-177068 | | 6/2001 |
| JP | 2002-057301 | | 2/2002 |
| JP | 2002-231905 | | 8/2002 |
| JP | 2002-270783 | | 9/2002 |
| JP | 2003-258201 | | 9/2003 |
| JP | 2003-264171 | | 9/2003 |
| JP | 2003-289134 | | 10/2003 |
| JP | 2004-022553 | | 1/2004 |
| JP | 2004-022554 | | 1/2004 |
| JP | 2004-040005 | | 2/2004 |
| JP | 2004-153006 | | 5/2004 |
| JP | 2004-158738 | | 6/2004 |
| WO | 2004-017410 | | 2/2004 |

* cited by examiner

SEMICONDUCTOR DEVICE AND FERROELECTRIC MEMORY, AND METHOD FOR MANUFACTURING SEMICONDUCTOR DEVICE

RELATED APPLICATIONS

This application claims priority to Japanese Patent Application No. 2004-188351 filed Jun. 25, 2004 which is expressly incorporated by reference herein in its entirety.

BACKGROUND

1. Technical Field

The present invention relates to semiconductor devices, ferroelectric memories, and methods for manufacturing semiconductor devices.

2. Related Art

Memories using ferroelectric (ferroelectric memories) are known to be advantageous over memories using dielectric materials in view of their lower power consumption. Further miniaturization and higher integration of ferroelectric memories are desired. However, in general, the leakage current in a cell of a ferroelectric memory increases as it is further miniaturized. For this reason, in the development of ferroelectric memories, there is a possibility that the advantages of ferroelectric memories as having lower power consumption may be spoiled if priority is given to their miniaturization. Accordingly, the cell size needs to be considered in conjunction with the permissible range of leakage currents and demands for the cell size.

Figure 5:
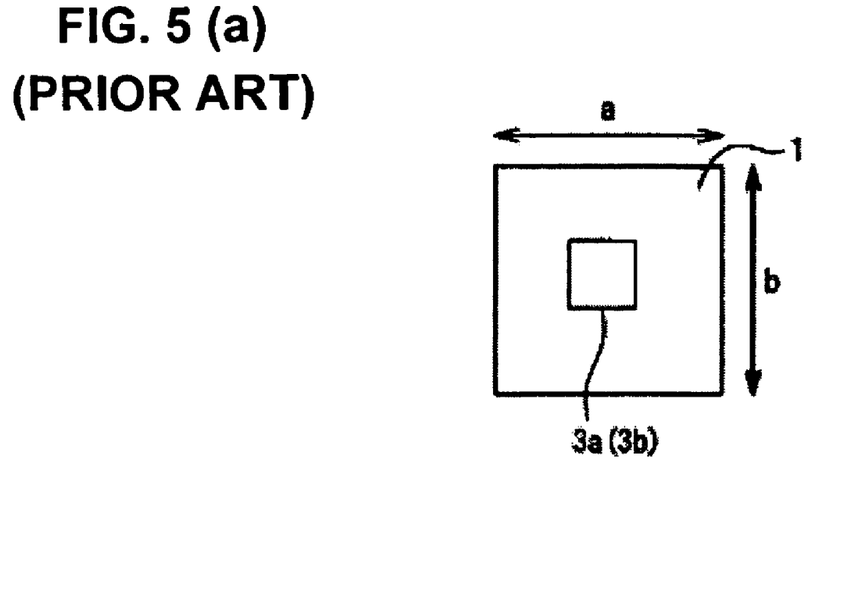
FIG. 5 includes views showing a memory with a conventional stacked type cell.

A ferroelectric memory can have a cell structure that is a stacked type or a planar type. FIG. 5 are figures showing a stacked type memory cell structure, wherein (a) shows an upper surface thereof, and (b) shows a cross section thereof. The memory cell shown in FIGS. 5 has a lower electrode 11, a ferroelectric layer 9, and an upper electrode 7. A plug 13 is formed below the lower electrode 11, thereby making an electrical contact between an ion implanted layer (not shown) and the lower electrode 11. Also, a dielectric film 15 composed of SiO$_2$ or the like is provided over the upper electrode 7, and a wiring layer 5 is formed over the dielectric film 15. The plug 13 is formed by embedding a contact hole 3a with a metal such as tungsten or the like. Also, the wiring layer 5 and the upper electrode 7 are electrically connected to each other through a contact hole 3b.

In the stacked type cell, the contact hole 3b is formed immediately above the contact hole 3a. For this reason, the stacked type cell has an upper surface that is square in which sides a and b in the figure are equal to each other. The structure of the illustrated stacked type cell is more advantageous in reducing the occupancy area of the cell than the planar type in which two contact holes are formed at positions separated from each other. For this reason, in view of further miniaturization of cells, it may be desirous to adopt stacked type cells in products. However, the stacked type cell has a structure in which the leak current is larger than that of the planar type cell, and if it is miniaturized to a desired size, its power consumption would reach a level unsuitable for practical use.

For this reason, in prior art, miniaturization of planar type cells, which are advantageous in view of power consumption, is examined. As the prior art, for example, a conventional technology described in Japanese Laid-open Patent Application HEI 10-229168 may be enumerated. HEI 10-229168 describes adjusting the positions of contact holes of planar type cells to thereby reduce the area occupied by the cells, and increase the degree of integration. Also, Japanese Laid-open Patent Application HEI 10-65113 proposes a technology to reduce the leakage current of planar type cells by providing an upper electrode and a lower electrode with different sizes.

However, the conventional technologies described above all use planar type cells, and intend to improve the same. For this reason, it is difficult to miniaturize these cells to a size that is equal to a cell size that can be achieved when stacked type cells are adopted. The present invention has been made in view of the problems described above, and its object is to provide semiconductor devices and ferroelectric memories which are of a stacked type, but whose leakage current is permissible even when they are miniaturized to a necessary size, and a method for manufacturing such semiconductor devices.

SUMMARY

To solve the problems described above, a semiconductor device in accordance with the present invention is characterized in comprising: a stacked type capacitor section having a first electrode provided on a first dielectric member, a charge accumulation member provided on the first electrode, and a second electrode provided on the charge accumulation member; a second dielectric member that electrically insulates the second electrode from a wiring member; a first contact hole that opens in the first dielectric member and is embedded with a conductive member for electrically connecting a conductive layer below the first dielectric member and the first electrode; and a second contact hole that opens in the second dielectric member for electrically connecting the second electrode and the wiring member, wherein the first contact hole and the second contact hole open at positions mutually deviated as viewed in a plan view of the stacked type capacitor section.

According to this invention, the stacked type capacitor section can be formed by providing the first electrode on the dielectric member, the charge accumulation member on the first electrode, and the second electrode thereon. Also, by opening the first contact hole in the dielectric member below the first electrode, and embedding the same with a conductive member to thereby form a plug, the first electrode and the conductive layer below the dielectric member can be electrically connected to each other through the plug. Also, the second contact hole is opened in the dielectric member over the second electrode, to thereby electrically connect the second electrode and the wiring member. Then, the first contact hole and the second contact hole can be opened at positions mutually deviated as viewed in a plan view of the stacked type capacitor section.

The charge accumulation member may suffer some damage from the plug that is formed. Also, it may suffer some damage when the contact hole is formed for connecting to the wiring. However, in accordance with the present invention, a section that suffers heavier damage by the plug formation and a section that suffers heavier damage by the contact hole formation are deviated from each other. For this reason, the overall damage that may be inflicted on the charge accumulation member is alleviated, such that the leakage current that flows in the charge accumulation member can be reduced. The present invention can thus provide a semiconductor device of a stacked type with a permissible leakage current, even when it is miniaturized to a necessary size.

Also, the semiconductor device in accordance with the present invention is characterized in that the second contact hole has a bottom surface that opens without overlapping an upper surface of the first contact hole as viewed in a plan view of the stacked type capacitor section.

According to this invention, a section that suffers heavier damage by the plug formation and a section that suffers heavier damage by the contact hole formation are deviated from each other. For this reason, the overall damage that may be inflicted on the charge accumulation member is alleviated, such that the leakage current that flows in the charge accumulation member can be reduced.

Also, the semiconductor device in accordance with the present invention is characterized in that the second contact hole opens in contact with the first contact hole along boundaries thereof as viewed in a plan view of the stacked type capacitor section.

According to this invention, while a section that suffers heavier damage by the plug formation and a section that suffers heavier damage by the contact hole formation can be deviated from each other, the contact holes can be brought closer to each other as much as possible whereby the area occupied by the cell can be minimized.

Also, the semiconductor device in accordance with the present invention is characterized in that the stacked type capacitor section has a generally rectangular shape as viewed in a plan view, the first contact hole is formed in one of two regions of the generally rectangular shape divided along a narrow side thereof, and the second contact hole is formed in the other region with respect to the region where the first contact hole is formed.

According to this invention, the first contact hole and the second contact hole can be formed at locations where damage to the charge accumulation member can be effectively avoided. Further, the area occupied by the capacitor section can be reduced, and the leakage current can also be reduced.

Also, the semiconductor device in accordance with the present invention is characterized in that the charge accumulation member is composed of ferroelectric. According to this invention, the invention can be applied to a semiconductor device that uses ferroelectric as a charge accumulation member.

Also, a ferroelectric memory in accordance with the present invention is characterized in comprising the semiconductor device recited in any one of the above.

According to this invention, a ferroelectric memory to which the semiconductor device recited in one of the above is applied can be provided.

Also, a method for manufacturing a semiconductor device in accordance with the present invention is characterized in comprising: a step of forming a first contact hole in a first dielectric member; a step of forming a conductive plug by embedding the first contact hole with a conductive member; a step of forming a first electrode layer on the conductive plug, which electrically connects to a local conductive layer blow the first dielectric member through the conductive plug; a step of providing a charge accumulation member on an upper surface of the first electrode layer; a step of providing a second electrode layer on an upper surface of a layer of the charge accumulation member; a step of forming a stacked type capacitor section by processing the first electrode layer, the charge accumulation member and the second electrode layer at once by a photolithography step; a step of forming a second dielectric member on the stacked type capacitor section; and a step of forming a second contact hole on the second dielectric member, which opens at a position deviated from the first contact hole as viewed in a plan view of the stacked type capacitor section.

According to this invention, the capacitor can be formed by providing the first electrode on the dielectric member, the charge accumulation member on the first electrode, and the second electrode thereon. Also, by opening the first contact hole in the dielectric member below the first electrode, and embedding the same with a conductive member to thereby form a plug, the first electrode and the local conductive layer can be electrically connected through the plug. Also, the second contact hole is opened in the dielectric member over the second electrode, to thereby electrically connect the second electrode and the wiring member. Then, the first contact hole and the second contact hole can be opened at positions deviated from each other as viewed in a plan view of the stacked type capacitor section.

The charge accumulation member may suffer some damage from the plug that is formed. Also, it may suffer some damage when the contact hole is formed for connecting to the wiring. However, in accordance with the present invention, a section that suffers heavier damage by the plug formation and a section that suffers heavier damage by the contact hole formation are deviated from each other. For this reason, the overall damage that may be inflicted on the charge accumulation member is alleviated, such that the leakage current that flows in the charge accumulation member can be reduced. The present invention can thus provide a method for manufacturing a semiconductor device of a stacked type with a permissible leakage current, even when it is miniaturized to a necessary size.

DETAILED DESCRIPTION

Figure 1A:
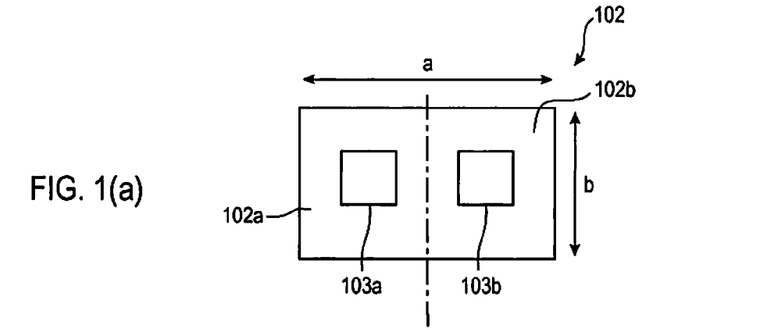
FIG. 1 includes views for describing a semiconductor device in accordance with embodiments of the present invention.
Figure 1B:
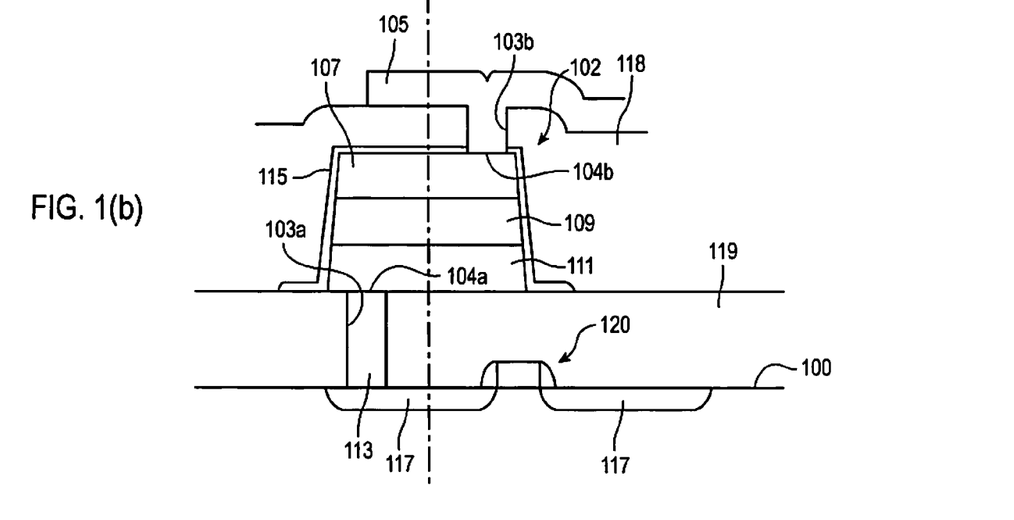

A ferroelectric memory in accordance with an embodiment of the present invention is described below with reference to the accompanying drawings. FIG. 1 are views for describing a ferroelectric memory in accordance with an embodiment of the present invention, wherein FIG. 1 (a) is a top surface view of a capacitor 102 among a cell 101 of the ferroelectric memory, and FIG. 1 (b) is a cross-sectional view thereof. It is noted that, in the present specification, the upper surface view indicated in FIG. 1 (a) corresponds to a plan view of a stacked type capacitor section to be described below.

A semiconductor device in accordance with the present embodiment is composed as a ferroelectric memory. An impurity layer 117 with an impurity injected therein is provided as a local conductive layer in a substrate, and the ferroelectric memory is formed on a $SiO_2$ layer 119 that is a first dielectric member on the impurity layer 117. The ferroelectric memory is equipped with a lower electrode 111 that is a first electrode provided on the $SiO_2$ layer 119, a ferroelectric layer 109 that is a charge accumulation member provided on the lower electrode 111, and an upper electrode 107 that is a second electrode provided on the ferroelectric layer 109.

Furthermore, the semiconductor device in accordance with the present invention has a wiring 105 that is provided over the upper electrode 107. The wiring 105 is equipped with an $SiO_2$ layer 118 that is a second dielectric member for electrically insulating the upper electrode 107 from the wiring 105. The $SiO_2$ layer 119 defines a contact hole 103a opened therein in which tungsten is embedded as a conductive member for electrically connecting the impurity layer 117 and the lower electrode 111 to thereby form a W plug 113. Also, the $SiO_2$ layer 118 defines a contact hole 103b for electrically connecting the upper electrode 107 and the wiring 105.

It the present embodiment, for example, a Ir/IrO$_x$/Pt composite film is used as the lower electrode 111, and for example, a Pt/IrO$_x$/Ir composite film is used as the upper electrode 107. Also, the ferroelectric layer 109 uses a PZT system material or a PZTN system material. Also, the wiring 105 is composed of aluminum, and the impurity layer 117 is a source or a drain of a transistor 120 provided on the substrate 100. Also, the structure composed of the lower electrode 111, the ferroelectric layer 109 and the upper electrode 107 is referred to as a stacked type capacitor section in the present embodiment. In accordance with the present embodiment, the capacitor section 102 is covered by a barrier film 115 composed of an alumina film or the like.

In the present embodiment, the contact hole 103a is a first contact hole, and the contact hole 103b is a second contact hole. The contact hole 103a and the contact hole 103b are opened at locations mutually deviated as viewed in a plan view of the capacitor section 102.

In the present embodiment, the capacitor section 102 has a generally rectangular shape as viewed in a plan view, and the contact hole 103a is formed in one region 101a of two regions of the generally rectangular shape divided along a narrow side thereof. Also, the contact hole 103b is formed in the other region 101b with respect to the region where the contact hole 103a is formed.

In accordance with the present embodiment, the contact hole 103a and the contact hole 103b are brought closer to each other to thereby reduce the occupancy area of the cell 101. Also, the contact hole 103a and the contact hole 103b are deviated from each other as viewed in a plan view of the stacked type capacitor section, in an attempt to prevent the same area of the ferroelectric layer 109 from being affected by contact hole and plug formation, and to reduce the leakage current. In view of this object, the deviated positions in accordance with the present embodiment may be particularly preferred, at least, when a bottom surface 104b of the contact hole 103b opens at a position that does not overlap an upper surface 104a of the contact hole 103a.

Figure 1C:
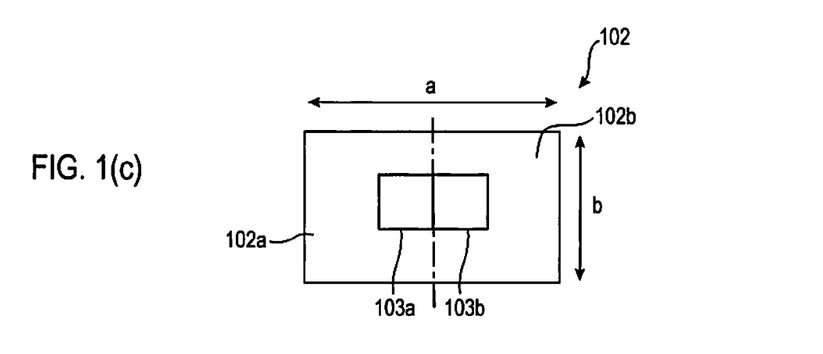

Also, in accordance with the present embodiment, in view of the conditions between the cell occupancy area and the leakage current, it is desirable to form the cell 101 in a manner that the side a indicated in the top surface view is about twice the side b. However, the present embodiment is not limited to such a structure, and in order to minimize the occupancy area of the cell 101, the contact hole 103b may be opened in a manner that its boundary is in contact with the contact hole 103a when the ferroelectric layer 109 is viewed from above. One exemplary implementation of this is shown in FIG. 1(c).

Figure 2:
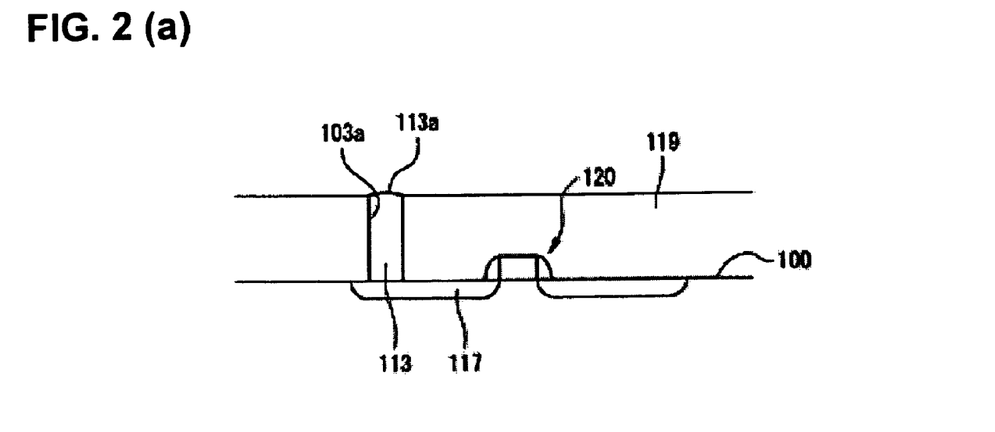
FIG. 2 is a process chart for describing a method for manufacturing the semiconductor device shown in FIG. 1.
Figure 3:
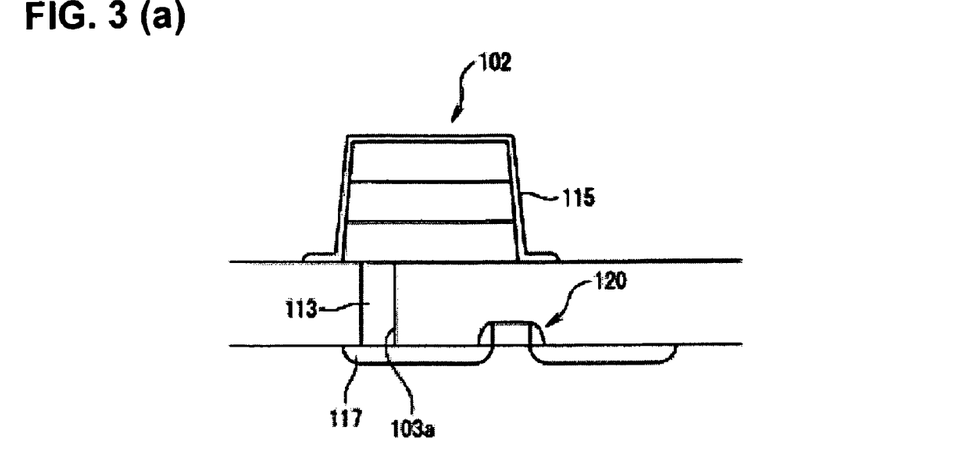
FIG. 3 is another process chart for describing the method for manufacturing the semiconductor device shown in FIG. 1.

FIGS. 2 (a)-(c), and FIGS. 3 (a)-(c) are a process chart for describing a method for manufacturing a semiconductor device indicated in FIG. 1. The semiconductor device in accordance with the present embodiment is manufactured by a method described below. First, according to the present embodiment, a contact hole 103a is formed in a SiO$_2$ 119 layer over an impurity layer 117. Next, the contact hole 103a is embedded with, for example, tungsten, to form a W plug 113. When the W plug 113 is formed, an upper surface 113a of the embedded tungsten is sufficiently planarized by a CMP (Chemical Mechanical Polishing) method or the like (FIG. 2 (a)).

Next, a Ir/IrO$_x$/Pt composite film 111a is formed by a sputter method of the like on the SiO$_2$ 119 layer in which the W plug 113 is formed. When forming the Ir/IrO$_x$/Pt composite film 111a, for example, a TiAlN film may be formed in advance for the purpose of preventing oxidation of tungsten. Next, for example, a PZTN system ferroelectric material is coated on the Ir/IrO$_x$/Pt composite film 111a, thereby forming a ferroelectric film 109a. Further, a Pt/IrO$_x$/Ir composite film 107a is formed by sputtering or the like on the ferroelectric film 109a (FIG. (b)).

Then, a resist is coated on the Pt/IrO$_x$/Ir composite film 107a, and a resist mask that matches with the shape of each cell is formed by photolithography. By conducting dry etching over the resist mask, the Ir/IrO$_x$/Pt composite film 111a, the ferroelectric film 109a, and the Pt/IrO$_x$/Ir composite film 107a are processed at once, whereby a capacitor section 102 is formed (FIG. 2 (c)).

Further, in accordance with the present embodiment, as shown in FIG. 3, the capacitor section 102 is covered by a barrier film 115 (FIG. 3 (a)), and after a SiO$_2$ layer is further provided, a contact hole 103b is opened therein (FIG. 3 (b)). As described above, the contact hole 103b is opened in a position over and within a range of the ferroelectric layer 109, and where it does not overlap the contact hole 103a above the surface of the ferroelectric layer 109.

Further, an aluminum film is formed over the contact hole 103b by sputtering, and is patterned into a wiring 105, whereby a cell 101 is completed.

Figure 4:
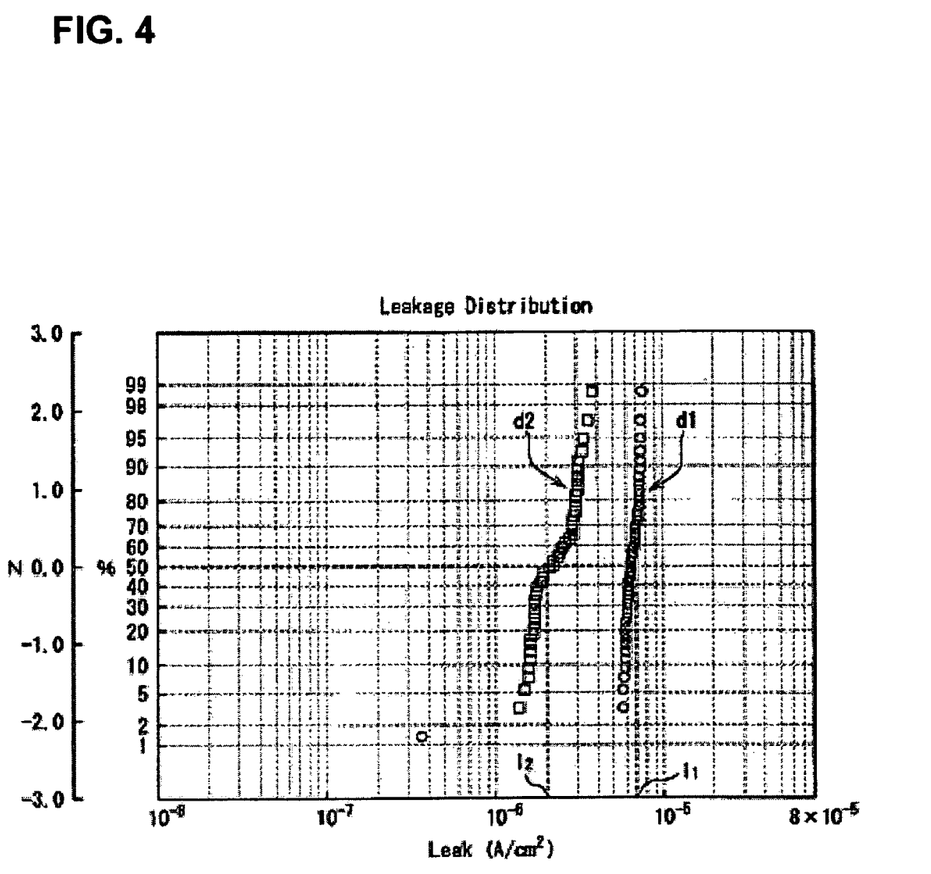
FIG. 4 is a graph for describing the effects of the embodiment of the present invention.

FIG. 4 is a graph for describing the effects of the present embodiment described above, which records values of leakage current along the axis of abscissas, and records, along the axis of ordinates, a distribution Z that expresses proportions of elements in percentage having the respective values of leakage current. The values of leakage current are obtained when a voltage of 3V is applied to electrodes. The data shown in FIG. 4 was obtained with ferroelectric memories of semiconductor devices each having a cell configuration in which the side a was longer than the side b as shown in FIG. 1. It is noted that, in the present embodiment, the side a was 2 μm in length and the side b was 1 μm in length.

In FIG. 4, d2 indicates data obtained with semiconductor devices in accordance with the present embodiment, and d1 indicates data obtained with semiconductor devices formed for comparison with d2, in which the length of the side a and the length of the side b are equal. The memories that gave the data d1 and the memories that gave the data d2 were manufactured in the same lot.

It is observed from FIG. 4 that 50% of the memories of the present embodiment have their leakage current in a range lower than 2 μA/cm$^2$ (indicated by I$_2$ in the graph). It is also observed that the memories that were manufactured in the same lot have their leakage current in a range lower than about 7 μA/cm$^2$ (indicated by I$_1$ in the graph).

According to the present embodiment described above, the present embodiment can provide semiconductor devices and ferroelectric memories which are of a stacked type but can reduce leakage current more than memories of the conventional stacked type cell, and a method for manufacturing such semiconductor devices. According to the present embodiment, there can be provided semiconductor devices and ferroelectric memories in which cells can be miniaturized with their leakage current controlled within a permissible range, and which are more miniaturized and have less current consumption than the conventional semiconductor devices, and a method for manufacturing such semiconductor devices.

What is claimed is:

1. A semiconductor device comprising:
    a substrate;
    a first insulating layer formed on the substrate, the first insulating layer having a first plug, the first plug having a first quadrate shape in plan view, the first quadrate having a first edge;
    a ferroelectric capacitor formed on the first insulating layer, the ferroelectric capacitor including a first electrode formed on the first insulating layer, a ferroelectric layer formed on the first electrode and a second electrode formed on the ferroelectric layer; and
    a second insulating layer formed on the second electrode, the second insulating layer having a second plug, the second plug having a second quadrate shape in plan view, the second quadrate having a second edge, the first edge coinciding with the second edge in plan view, and the first quadrate not overlapping the second quadrate in plan view.

2. A semiconductor device comprising:

a substrate;

a first insulating layer formed on the substrate, the first insulating layer having a first plug, the first plug having a first quadrate shape in plan view, the first quadrate having a first edge;

a ferroelectric capacitor formed on the first insulating layer, the ferroelectric capacitor including a first electrode formed on the first insulating layer, a ferroelectric layer formed on the first electrode and a second electrode formed on the ferroelectric layer; and a second insulating layer formed on the second electrode, the second insulating layer having a second plug, the second plug having a second quadrate shape in plan view, the second quadrate having a second edge, the first edge aligned with the second edge in plan view, and the first quadrate not overlapping the second quadrate in plan view.

* * * * *